United States Patent
Park et al.

(10) Patent No.: US 11,187,839 B2
(45) Date of Patent: Nov. 30, 2021

(54) DISPLAY DEVICE HAVING AN EYEPIECE

(71) Applicant: LG DISPLAY CO., LTD., Seoul (KR)

(72) Inventors: Ju-Seong Park, Goyang-si (KR); Sung-Min Jung, Seoul (KR); Keong-Jin Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 174 days.

(21) Appl. No.: 16/204,548

(22) Filed: Nov. 29, 2018

(65) Prior Publication Data

US 2019/0196174 A1   Jun. 27, 2019

(30) Foreign Application Priority Data

Dec. 26, 2017  (KR) .......................... 10-2017-0179352

(51) Int. Cl.
  *G02B 5/30*   (2006.01)
  *H01L 51/52*  (2006.01)
  (Continued)

(52) U.S. Cl.
  CPC ............. *G02B 5/30* (2013.01); *G02B 5/3025* (2013.01); *G02B 5/3083* (2013.01);
  (Continued)

(58) Field of Classification Search
  CPC ............. G02B 27/0172; G02B 27/286; G02B 25/001; G02B 5/30; G02B 5/3025;
  (Continued)

(56) References Cited

U.S. PATENT DOCUMENTS 6,853,491 B1   2/2005  Ruhle et al.
8,493,520 B2 *  7/2013  Gay ....................... G02B 30/27
                                                    349/15
(Continued)

FOREIGN PATENT DOCUMENTS

CN   1930511 A    3/2007
CN   101344669 A  1/2009
(Continued)

OTHER PUBLICATIONS

Wei-Qing et el., "See-through helmet-mounted display based upon polarization beam splitter", Optical and Optoelectronic Technology Exchange Conference of China Ordnance Society, China Ordnance, vol. 35, Dec. 31, 2009, pp. 124-130 (pp. 1-4), with English abstract.

*Primary Examiner* — Kristina M Deherrera
(74) *Attorney, Agent, or Firm* — Birch, Stewart, Kolasch & Birch, LLP

(57) ABSTRACT

A display device including a display panel and an eyepiece is provided. An image realized by the display panel can be provided to a user by passing through the eyepiece. The display device can further include a front quarter-wave plate and a rear quarter-wave plate in order to increase the path of light traveling toward the eyepiece from the display panel. A barrier can be disposed between the front quarter-wave plate and the rear quarter-wave plate. The barrier can reflect or transmit the light traveling toward the eyepiece from the display panel on a region-by-region, so that the loss of light recognized by the user through the eyepiece can be minimized.

18 Claims, 14 Drawing Sheets

(51) Int. Cl.
*G02B 27/28* (2006.01)
*G02B 27/01* (2006.01)
*G02B 25/00* (2006.01)

(52) U.S. Cl.
CPC ....... *G02B 27/0172* (2013.01); *G02B 27/286* (2013.01); *H01L 51/5275* (2013.01); *G02B 25/001* (2013.01); *G02B 2027/0118* (2013.01); *G02B 2027/0178* (2013.01)

(58) Field of Classification Search
CPC .......... G02B 5/3083; G02B 2027/0118; G02B 2027/0178; H01L 51/5275
USPC .................................................. 359/489.07
See application file for complete search history.

(56) References Cited

U.S. PATENT DOCUMENTS

| | | |
|---|---|---|
| 2016/0223817 A1 | 8/2016 | Kizu et al. |
| 2017/0227770 A1 | 8/2017 | Carollo et al. |
| 2018/0138458 A1* | 5/2018 | Tokuda ............... H01L 51/5275 |

FOREIGN PATENT DOCUMENTS

| | | |
|---|---|---|
| CN | 101681023 A | 8/2010 |
| CN | 104536220 A | 4/2015 |
| CN | 105572894 A | 5/2016 |
| CN | 105911709 A | 8/2016 |
| CN | 106716221 A | 5/2017 |
| EP | 0 718 645 A2 | 6/1996 |
| WO | WO 2010/125337 A2 | 11/2010 |

* cited by examiner

DISPLAY DEVICE HAVING AN EYEPIECE

CROSS-REFERENCE TO RELATED APPLICATION

This application claims the priority benefit of Korean Patent Application No. 10-2017-0179352, filed on Dec. 26, 2017 in the Republic of Korea, which is hereby incorporated by reference as if fully set forth herein.

BACKGROUND OF THE INVENTION

Field of the Invention

The present invention relates to a display device in which an image realized by a display panel is provided through an eyepiece.

Discussion of the Related Art

Generally, a display device includes a display panel which realizes an image. For example, the display device can include a Liquid Crystal Display (LCD) panel having liquid crystal molecules or an Organic Light-Emitting Diode (OLED) panel having organic light-emitting elements.

The display device can provide an image realized by the display panel to a user through an eyepiece. For example, the display device can be a head mounted display apparatus (HMD) including an image member accommodating the display panel, an eyepiece coupled to the image member and a mounting member for aligning the eyepiece with the user's eye.

In the display device, the resolution of the image provided to the user can be determined according to the length of a path of light travelling toward the eyepiece from the display panel. For example, the resolution of the display device can be proportional with the length of the path of light travelling toward the eyepiece from the display panel. Thus, the display device can increase the path of light travelling toward the eyepiece from the display panel by using a half-mirror, in order to improve the resolution without the change of the overall thickness. However, in the display device of the related art, the amount of the light emitted to the outside can be reduced by the half-mirror, which can cause a problem.

SUMMARY OF THE INVENTION

Accordingly, the present invention is directed to a display device that substantially obviates one or more problems due to limitations and disadvantages of the related art.

An object of the present invention is to provide a display device capable of increasing the light extraction efficiency without the deterioration of the resolution.

Another object of the present invention is to provide a display device in which a path of light travelling toward an eyepiece from a display panel can be increased, and the loss of the light between the display panel and the eyepiece can be minimized.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, there is provided a display device including a front quarter-wave plate between a display panel and an eyepiece. A rear quarter-wave plate is disposed between the front quarter-wave plate and the eyepiece. A front linear polarizer is disposed between the display panel and the front quarter-wave plate. A reflective polarizing plate is disposed between the rear quarter-wave plate and the eyepiece. A barrier is disposed between the front quarter-wave plate and the rear quarter-wave plate. The barrier includes reflecting regions and transmitting regions. Each of the transmitting regions is disposed between the reflecting regions.

The barrier can include a supporting substrate and reflective patterns. The reflective patterns can be disposed on the supporting substrate. The reflective patterns can overlap the reflecting regions.

The reflective patterns can include a metal. The reflective patterns can be disposed on a surface of the supporting substrate facing the display panel.

The display panel can include pixel regions. The pixel regions of the display panel can overlap the transmitting regions of the barrier.

Each of the transmitting regions can have a size larger than the corresponding pixel region.

Each of the transmitting regions can be disposed closer to the center of the display panel than the corresponding pixel region.

In another embodiment, the display device includes a display panel. The display panel includes pixel regions. A front linear polarizer is disposed on the display panel. A front quarter-wave plate is disposed on the front linear polarizer. A rear quarter-wave plate is disposed on the front quarter-wave plate. A reflective polarizing plate is disposed on the rear quarter-wave plate. An eyepiece is disposed on the reflective polarizing plate. Reflective patterns are disposed between the front quarter-wave plate and the rear quarter-wave plate. The reflective patterns expose a portion of the front quarter-wave plate. The pixel regions of the display panel overlap the portion of the front quarter-wave plate exposed by the reflective patterns.

The portion of the front quarter-wave plate exposed by the reflective patterns can be in a bar shape extending in a direction.

The reflective patterns can be in direct contact with the front quarter-wave plate.

The front linear polarizer can be in direct contact with the display panel and the front quarter-wave plate.

A phase of light passing through the rear quarter-wave plate can be delayed in a direction opposite to a phase of light passing through the front quarter-wave plate.

The polarized state of light passing through the reflective polarizing plate can be perpendicular to the polarized state of light passing through the front linear polarizer.

A rear linear polarizer can be disposed between the reflective polarizing plate and the eyepiece. The transmission axis of the rear linear polarizer can be parallel with the transmission axis of the reflective polarizing plate.

BRIEF DESCRIPTION OF THE DRAWINGS

The accompanying drawings, which are included to provide a further understanding of the invention and are incor- In the drawings.

DETAILED DESCRIPTION OF THE EMBODIMENTS

Figure 1:
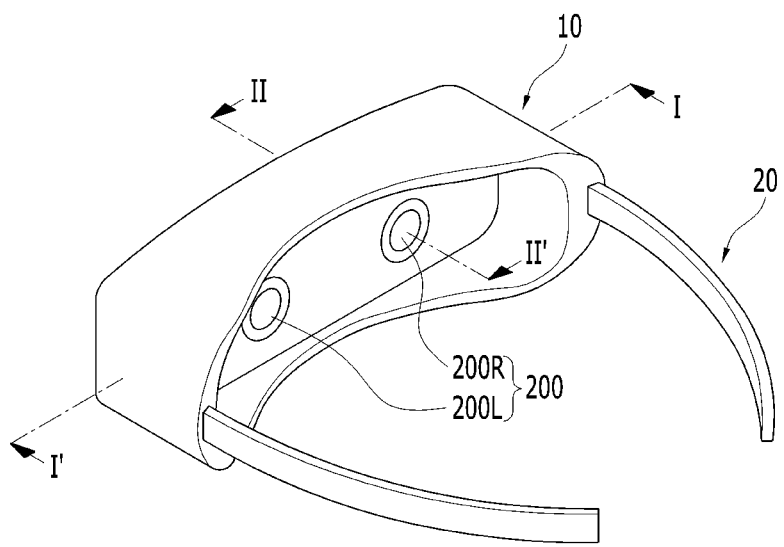
FIG. 1 is a view schematically showing a display device according to an embodiment of the present invention.

Hereinafter, details related to the above objects, technical configurations, and operational effects of the embodiments of the present invention will be clearly understood by the following detailed description with reference to the drawings, which illustrate some embodiments of the present invention. Here, the embodiments of the present invention are provided in order to allow the technical spirit of the present invention to be satisfactorily transferred to those skilled in the art, and thus the present invention can be embodied in other forms and is not limited to the embodiments described below.

In addition, the same or extremely similar elements can be designated by the same reference numerals throughout the specification, and in the drawings, the lengths and thickness of layers and regions can be exaggerated for convenience. It will be understood that, when a first element is referred to as being "on" a second element, although the first element can be disposed on the second element so as to come into contact with the second element, a third element can be interposed between the first element and the second element.

Here, terms such as, for example, "first" and "second" can be used to distinguish any one element with another element. However, the first element and the second element can be arbitrary named according to the convenience of those skilled in the art without departing the technical spirit of the present invention.

The terms used in the specification of the present invention are merely used in order to describe particular embodiments, and are not intended to limit the scope of the present invention. For example, an element described in the singular form is intended to include a plurality of elements unless the context clearly indicates otherwise. In addition, in the specification of the present invention, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiments

Figure 2A:
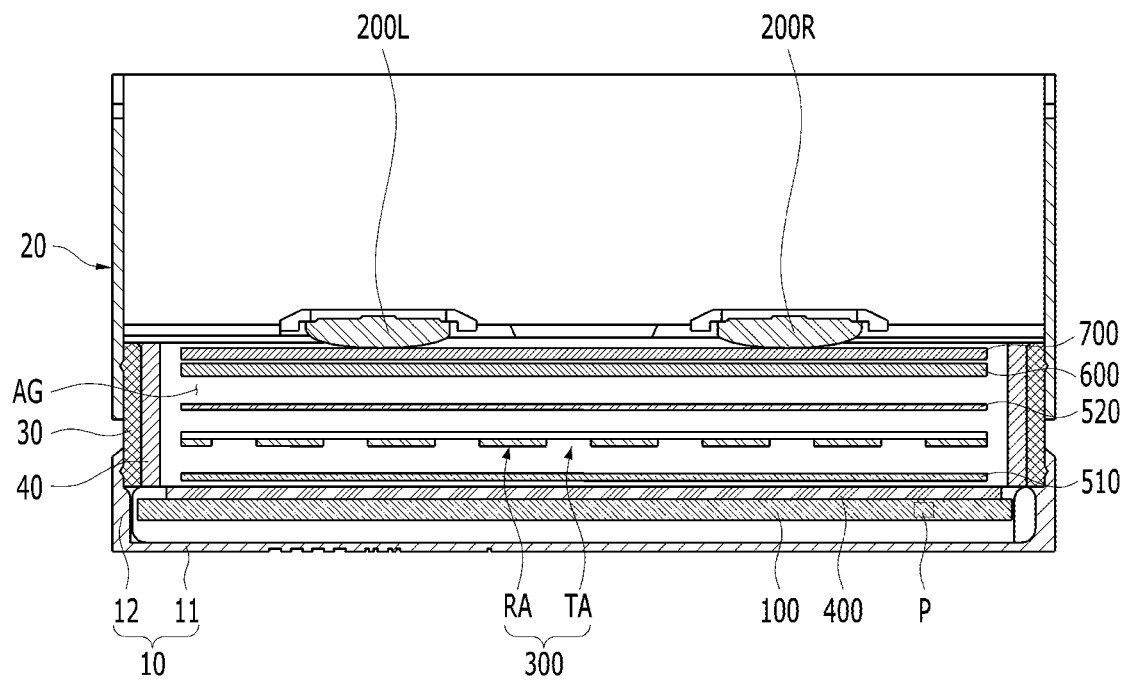
FIG. 2A is a view taken along I-I' of FIG. 1.
Figure 2B:
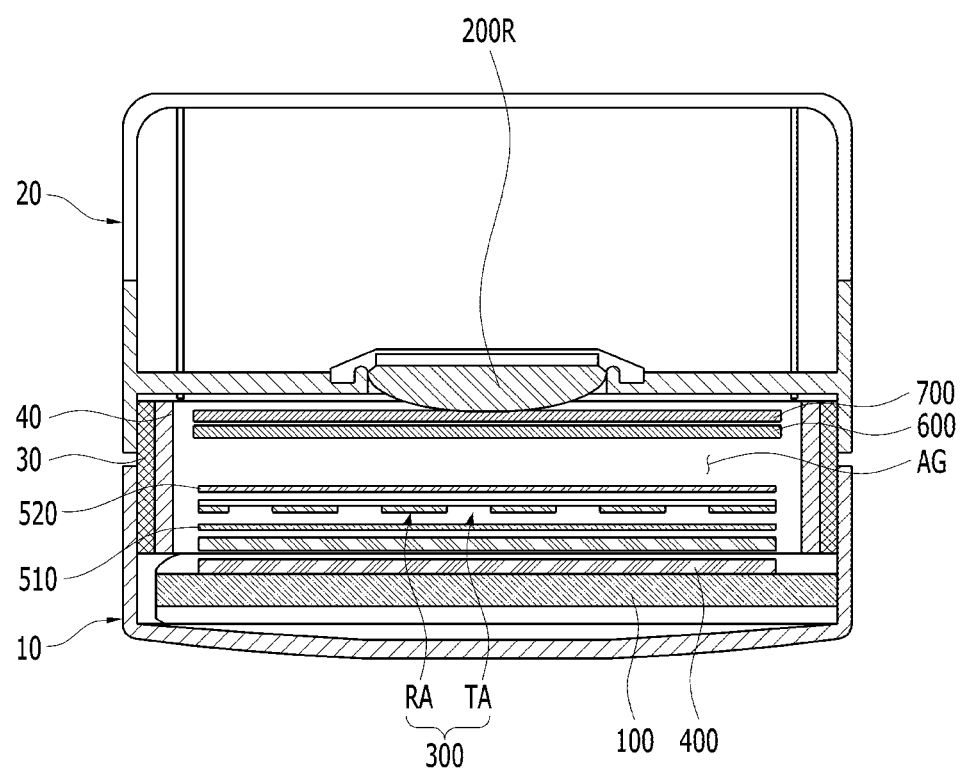
FIG. 2B is a view taken along II-II' of FIG. 1.
Figure 3:
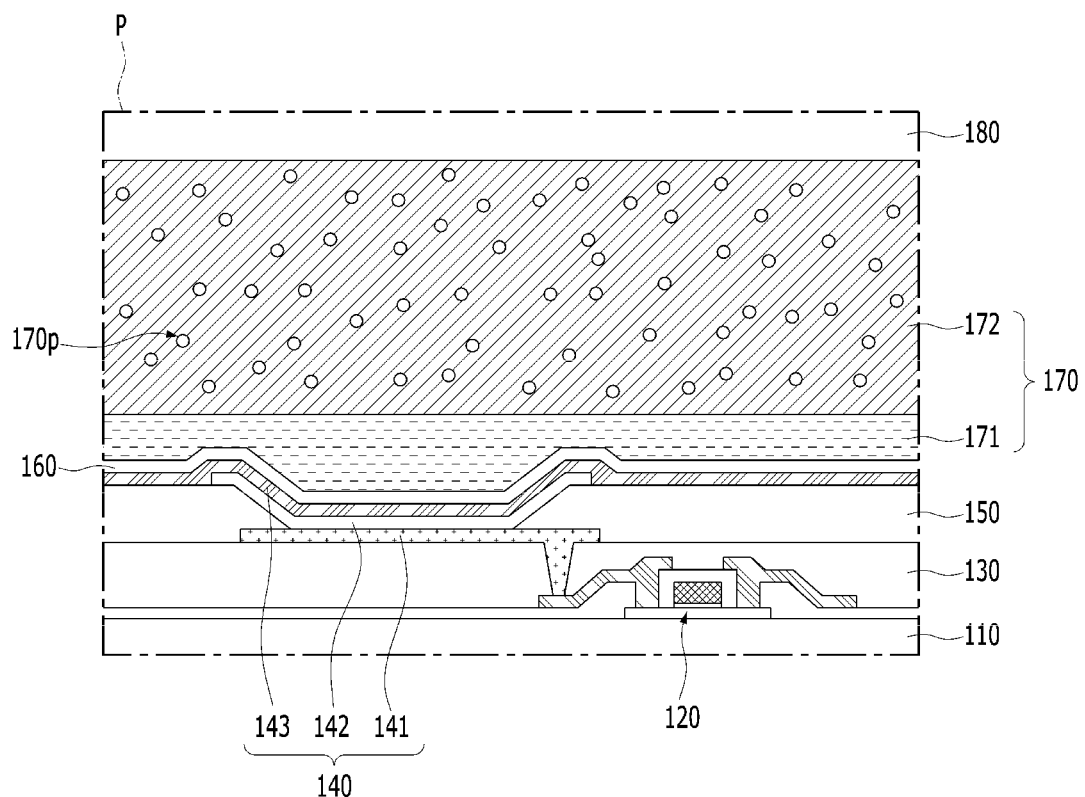
FIG. 3 is an enlarged view of P region in FIG. 2A.
Figure 4:
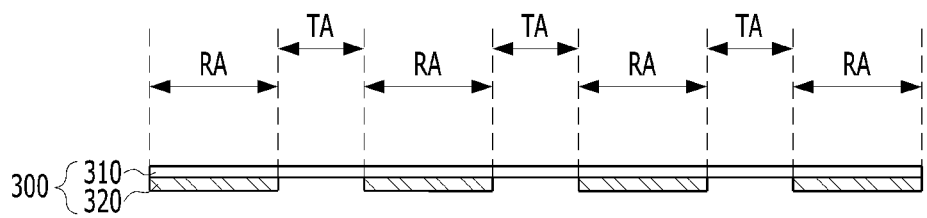
FIG. 4 is a view showing a barrier of the display device according to the embodiment of the present invention.
Figure 5:
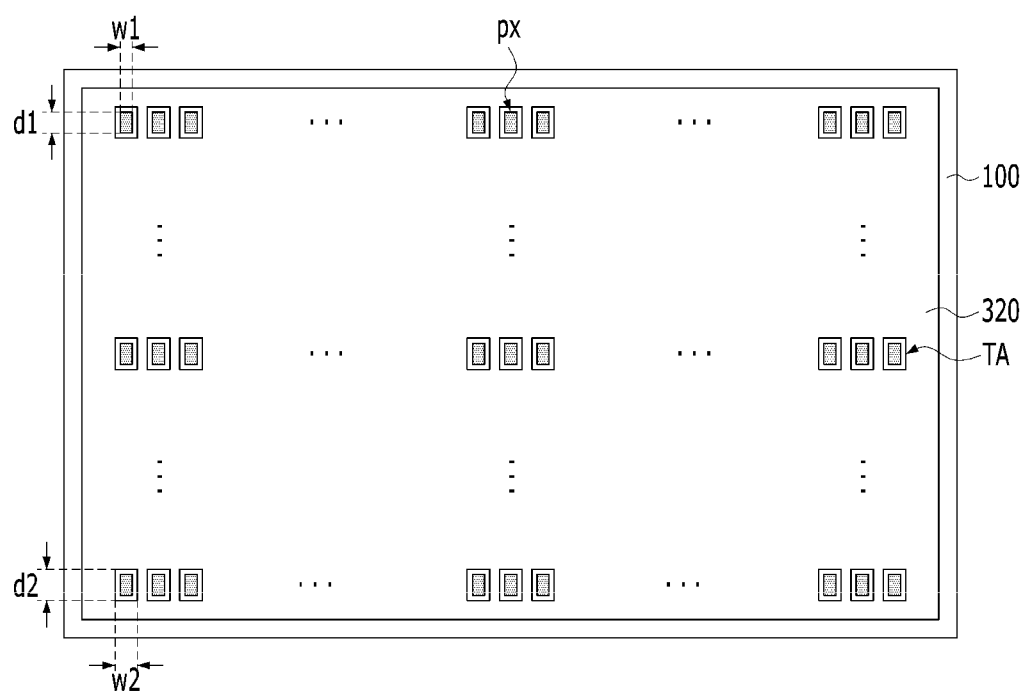
FIG. 5 is a view showing the relative location of pixel regions of a display panel and transmitting regions of a barrier in the display device according to the embodiment of the present invention.

FIG. 1 is a view schematically showing a display device according to an embodiment of the present invention. FIG. 2A is a view taken along I-I' of FIG. 1. FIG. 2B is a view taken along II-II' of FIG. 1. FIG. 3 is an enlarged view of P region in FIG. 2A. FIG. 4 is a view showing a barrier of the display device according to the embodiment of the present invention. FIG. 5 is a view showing the relative location of pixel regions of a display panel and transmitting regions of a barrier in the display device according to the embodiment of the present invention. All the components of the display device according to all embodiments of the present invention are operatively coupled and configured.

Referring FIGS. 1, 2A, 2B and 3 to 5, the display device according to the embodiment of the present invention can include an image member 10. The image member 10 can realize an image which is provided to a user. For example, the image member 10 can realize an image for a virtual reality (VR) or an augmented reality (AR).

The image member 10 can be fixed to the front of the user's eye by a mounting member 20. For example, the display device according to the embodiment of the present invention can be a head mounted display apparatus (HMD) mounted on the user' head. The mounting member 20 can have a shape like a leg of an eyeglass frame. For example, the mounting member 20 can be extended from the image member 10 in a direction. The mounting member 20 can be coupled to the image member 10 by a coupling member 30. For example, the coupling member 30 can have a plate shape including a first end portion coupling to the image member 10, and a second end portion coupling to the mounting member 20. The coupling member 30 can be disposed at the inside of the image member 10 and the inside of the mounting member 20.

In the display device according to the embodiment of the present invention, the location of the image member 10 is fixed by using the user's ears, such as an eyeglass. However, the display device according to another embodiment of the present invention can include the image member 10 supported by other parts of the user. For example, the display device according to another example of the present invention can be in a head gear shape which is worn on the user's head.

A display panel 100 can be disposed in the image member 10. The display panel 100 can be disposed on an inner surface of the image member 10. For example, the image member 10 can include a supporting part 11 supporting the display panel 100, and a coupling part 12 protruding from an edge of the supporting part 11. The coupling member 30 can be coupled to the coupling part 12 of the image member 10. The coupling part 12 can be surround side surfaces of the display panel 100.

The display panel 100 can generate the image which is provided to the user. For example, the display panel 100 can include pixel regions PX. Each of the pixel regions PX can include a light-emitting element 140 which emits light displaying a specific color. For example, the light-emitting element 140 can include a lower electrode 141, a light-emitting layer 142 and an upper electrode 143, which are sequentially stacked. The light-emitting layer 142 can include an emission material layer (EML) formed of an organic material, an inorganic material or a hybrid material. For example, the display panel 100 of the display device according to the embodiment of the present invention can be an OLED panel. However, the display panel 100 can be other types such as an LCD panel.

The light-emitting element 140 can be disposed between a lower substrate 110 and an upper substrate 180. A thin film transistor 120 can be disposed between the lower substrate 110 and the light-emitting element 140. The light-emitting element 140 can be controlled by the thin film transistor 120. For example, the lower electrode 141 of the light-emitting element 140 can be in direct contact with a portion of the thin film transistor 120. An over-coat layer 130 can be disposed between the thin film transistor 120 and the light-emitting element 140. The over-coat layer 130 can remove a thickness difference due to the thin film transistor 120. The over-coat layer 130 can include an electrode contact hole exposing the portion of the thin film transistor 120.

A bank insulating layer 150 can be disposed on the over-coat layer 130. The bank insulating layer 150 can cover an edge of the lower electrode 141. The light-emitting layer 142 and the upper electrode 143 can be stacked on a portion of the lower electrode 141 exposed by the bank insulating layer 150. The light-emitting layer 142 and/or the upper electrode 143 can be extended on the bank insulating layer 150.

An upper passivation layer 160 can be disposed on the light-emitting element 140. The upper passivation layer 160 can prevent the damage of the light-emitting element 140 due to the external impact and moisture. A filling element 170 can be disposed between the upper passivation layer 160 and the upper substrate 180. The filling element 170 can include an adhesive material. For example, the upper substrate 180 can be coupled to the lower substrate 110 in which the light-emitting element 140 is formed, by the filling element 170. The filling element 170 can have a multi-layer structure. For example, the filling element 170 can include a lower filling layer 171 and an upper filling layer 172, which are sequentially stacked. The upper filling layer 172 can include a moisture-absorbing material 170p. The stress applied to the light-emitting element 140 due to the expansion of the moisture-absorbing material 170p can be relieved by the lower filling layer 171.

An eyepiece 200 can be disposed on the display panel 100. The light emitted from the display panel 100 can be provided to the user passing through the eyepiece 200. The image realized by the display panel 100 can be recognized to the user through the eyepiece 200. The eyepiece 200 can be aligned with the user's eye by the mounting member 20. For example, the eyepiece 200 can include a left lens 200L aligned with the left eye of the user, and a right lens 200R aligned with the right eye of the user. The position of the eyepiece 200 can be fixed by the image member 10. For example, the eyepiece 200 can be coupled to a region of the image member 10.

Optical elements can be disposed between the display panel 100 and the eyepiece 200 to increase a path of light travelling toward the eyepiece 200 from the display panel 100. For example, a barrier 300, a front linear polarizer 400, a front quarter-wave plate 510, a rear quarter-wave plate 520, a reflective polarizing plate 600 and a rear linear polarizer 700 can be disposed between the display panel 100 and the eyepiece 200.

The barrier 300 can be disposed between the display panel 100 and the eyepiece 200. The barrier 300 can reflect or transmit the light emitted from the display panel 100 on a region-by-region. For example, the barrier 300 can include reflecting regions RA and transmitting regions TA. Each of the transmitting regions TA can be disposed between the reflecting regions RA.

The reflecting regions RA can reflect the light incident on the barrier 300. The light incident on the transmitting regions TA of the barrier 300 can transmit through the barrier 300. For example, the barrier 300 can include a supporting substrate 310 and reflective patterns 320 disposed on the supporting substrate 310. The supporting substrate 310 can include a transparent material. For example, the supporting substrate 310 can include glass or plastic. The reflective patterns 320 can include a material having high reflectance. For example, the reflective patterns 320 can include a metal, such as aluminum (Al) and silver (Ag). The reflective patterns 320 can overlap the reflecting regions RA. The light incident on the reflecting regions RA of the barrier 300 can be reflected by the reflective patterns 320. The transmitting regions TA can include a portion of the supporting substrate 310 exposed by the reflective patterns 320.

The transmitting regions TA of the barrier 300 can overlap the pixel regions PX of the display panel 100. The width w1 and the length d1 of each pixel region PX can be smaller than the width w2 and the length d2 of the corresponding transmitting region TA. For example, the pixel regions PX can be disposed inside the transmitting regions TA. The relative location of the transmitting regions TA with respect to the pixel regions PX can be constant on the entire surface of the display panel 100. For example, the center of each pixel region PX can be the same as the center of the corresponding transmitting region TA.

The front linear polarizer 400 can be disposed between the display panel 100 and the barrier 300. The front linear polarizer 400 can include a transmission axis in a first direction. For example, the light passing through the front linear polarizer 400 can be linearly polarized in the first direction.

The front quarter-wave plate 510 can be disposed between the front linear polarizer 400 and the barrier 300. The front linear polarizer 400 can be disposed between the display panel 100 and the front quarter-wave plate 510. The front quarter-wave plate 510 can delay the phase of incident light by $\lambda/4$. For example, the light passing through the front quarter-wave plate 510 can be circularly polarized.

The rear quarter-wave plate 520 can be disposed between the barrier 300 and the eyepiece 200. The barrier 300 can be disposed between the front quarter-wave plate 510 and the rear quarter-wave plate 520. The rear quarter-wave plate 520 can delay the phase of incident light. The phase of the light passing through the rear quarter-wave plate 520 can be delayed in a direction opposite to the phase of the light passing through the front quarter-wave plate 510. For example, the rear quarter-wave plate 520 can delay the phase of incident light by $-\lambda/4$. The light circularly polarized by the front quarter-wave plate 510 can be linearly polarized in the same direction as the light incident on the front quarter-wave plate 510 by the rear quarter-wave plate 520.

The reflective polarizing plate 600 can be disposed between the rear quarter-wave plate 520 and the eyepiece 200. The rear quarter-wave plate 520 can be disposed between the barrier 300 and the reflective polarizing plate 600. The reflective polarizing plate 600 can reflect the light linearly polarized in a specific direction. For example, the reflective polarizing plate 600 can reflect the light linearly polarized in the first direction. The light linearly polarized in a second direction perpendicular to the first direction can transmit through the reflective polarizing plate 600. The reflective polarizing plate 600 can include an advanced polarizing film (APF) or a dual brightness enhanced film (DBEF).

The reflective polarizing plate 600 can be disposed close to the eyepiece 200. For example, an air-gap (AG) can be disposed between the rear quarter-wave plate 520 and the reflective polarizing plate 600.

The rear linear polarizer 700 can be disposed between the reflective polarizing plate 600 and the eyepiece 200. The transmission axis of the rear linear polarizer 700 can be parallel with the transmission axis of the reflective polarizing plate 600.

FIGS. 6 to 13 are views sequentially showing the moving direction and the polarized state of light travelling toward an eyepiece from a display panel in the display device according to the embodiment of the present invention.

Figure 6:
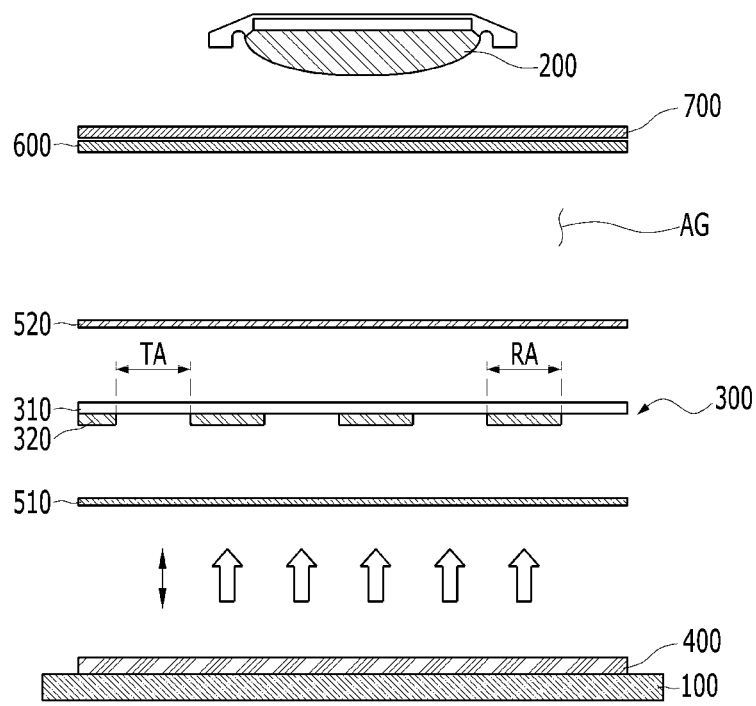
FIGS. 6 to 13 are views sequentially showing the moving direction and the polarized state of light travelling toward an eyepiece from a display panel in the display device according to the embodiment of the present invention.

The movement path and the polarized state of the light emitted from the display panel 100 of the display device according to the embodiment of the present invention will be described with reference to FIGS. 6 to 13. First, the light emitted from the display panel 100 of the display device according to the embodiment of the present invention can pass through the front linear polarizer 400, as shown in FIG. 6.

The light passing through the front linear polarizer 400 can move toward the front quarter-wave plate 510. The light passing through the front linear polarizer 400 can be linearly polarized in the first direction. For example, the light incident on the front quarter-wave plate 510 can be the light linearly polarized in the first direction.

Figure 7:
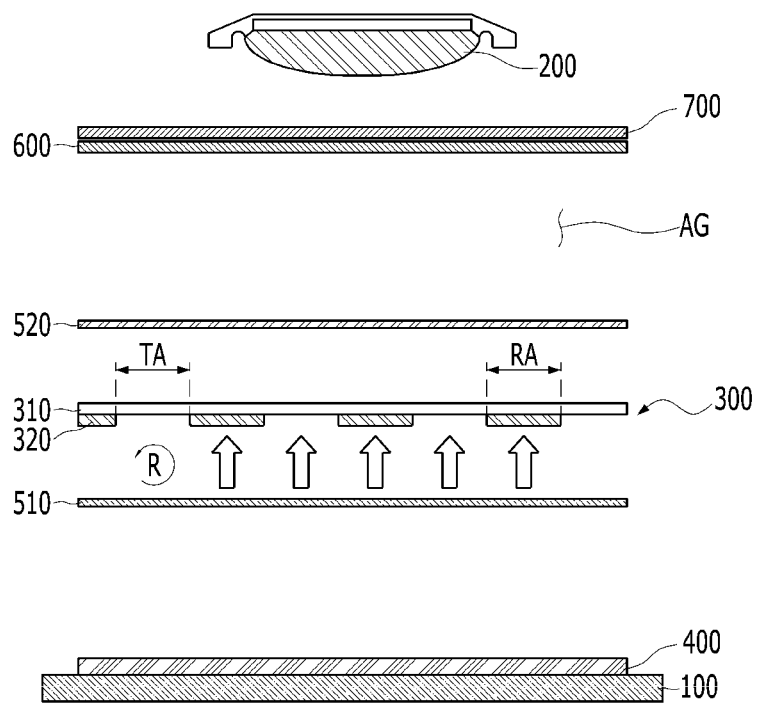

In the display device according to the embodiment of the present invention, the light passing through the front quarter-wave plate 510 can move toward the reflecting regions RA and the transmitting regions TA of the barrier 300, as shown in FIG. 7.

The light passing through the front quarter-wave plate 510 can be circularly polarized. For example, the light linearly polarized in the first direction by the front linear polarizer 400 can be right-circularly polarized by the front quarter-wave plate 510. The light incident on the barrier 300 can be the light right-circularly polarized.

Figure 8:
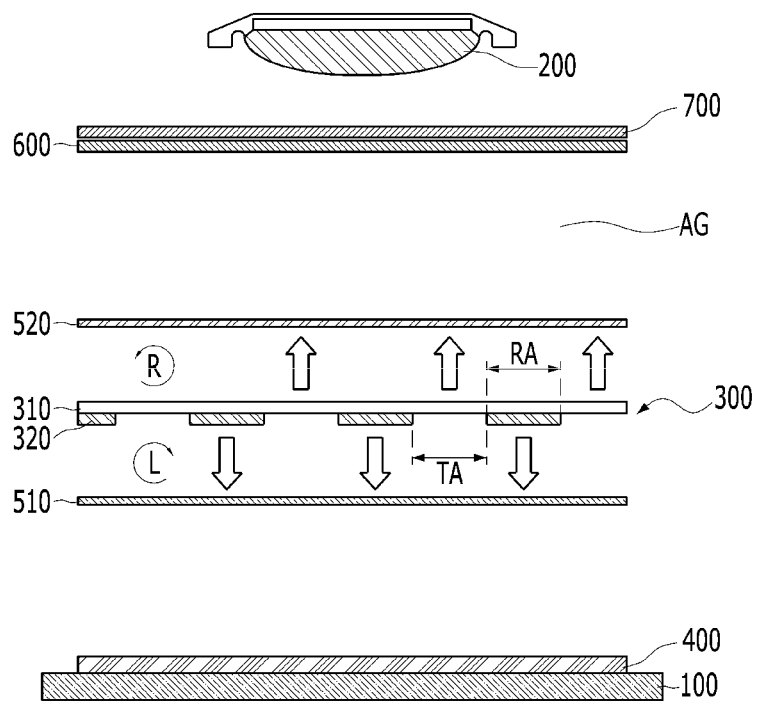

In the display device according to the embodiment of the present invention, the light incident on the barrier 300 can be reflected or transmitted on a region-by-region, as shown in FIG. 8.

The light incident on the reflecting regions RA of the barrier 300 can be reflected toward the display panel 100 by the reflective patterns 320. Since the light incident on the barrier 300 is the light which is right-circularly polarized, the light reflected by the reflective patterns 320 can be the light which is left-circularly polarized.

The light incident on the transmitting regions TA of the barrier 300 can transmit through the barrier 300. The light passing through the barrier 300 can move toward the rear quarter-wave plate 520. For example, the light incident on the rear quarter-wave plate 520 passing through the transmitting regions TA of the barrier 300 can be the light which is right-circularly polarized.

Figure 9:
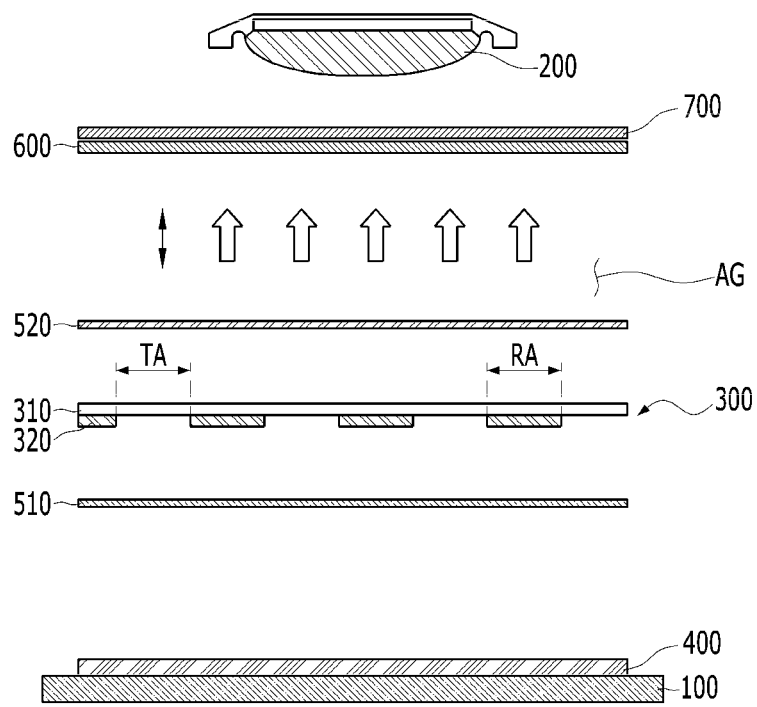

In the display device according to the embodiment of the present invention, the light passing through the rear quarter-wave plate 520 can move toward the reflective polarizing plate 600, as shown in FIG. 9.

The rear quarter-wave plate 520 can delay the phase of the light in a direction opposite to the front quarter-wave plate 510. For example, the light which is right-circularly polarized can become the light linearly polarized in the first direction by the rear quarter-wave plate 520. The light incident on the reflective polarizing plate 600 can be the light linearly polarized in the first direction.

Figure 10:
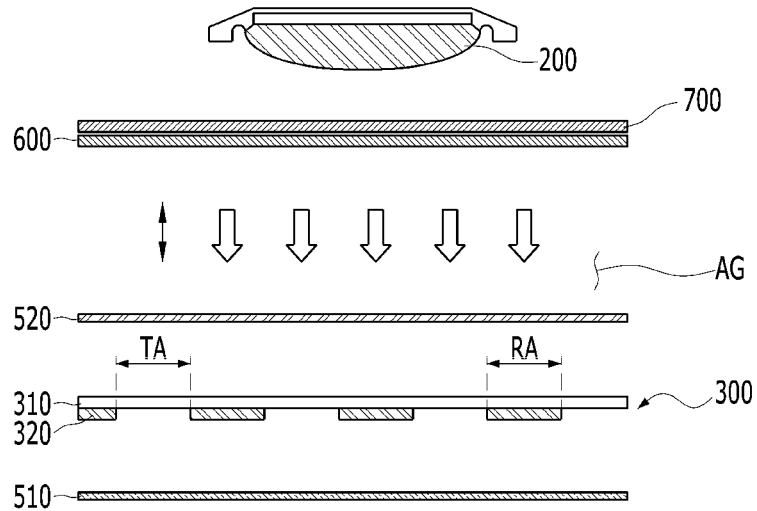

In the display device according to the embodiment of the present invention, the light which is linearly polarized in the first direction can be reflected toward the barrier 300 by the reflective polarizing plate 600, as shown in FIG. 10. For example, the transmission axis of the reflective polarizing plate 600 can be perpendicular to the transmission axis of the front linear polarizer 400.

Figure 11:
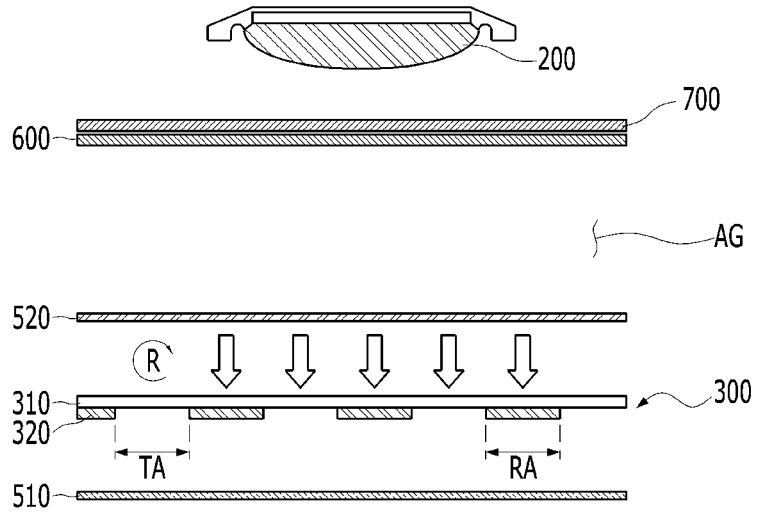

In the display device according to the embodiment of the present invention, the light reflected by the reflective polarizing plate 600 can transmit through the rear quarter-wave plate 520, as shown in FIG. 11.

The light passing through the rear quarter-wave plate 520 can move toward the barrier 300. Since the rear quarter-wave plate 520 delays the phase of the light in a direction opposite to the front quarter-wave plate 510, the light incident on the barrier 300 after passing through the rear quarter-wave plate 520 can be the light which is right-circularly polarized. The rotation direction of the polarized light incident on the barrier 300 after passing through the rear quarter-wave plate 520 can be opposite to the rotation direction of the polarized light incident on the rear quarter-wave plate 520 after passing through the transmitting regions TA of the barrier 300.

Figure 12:
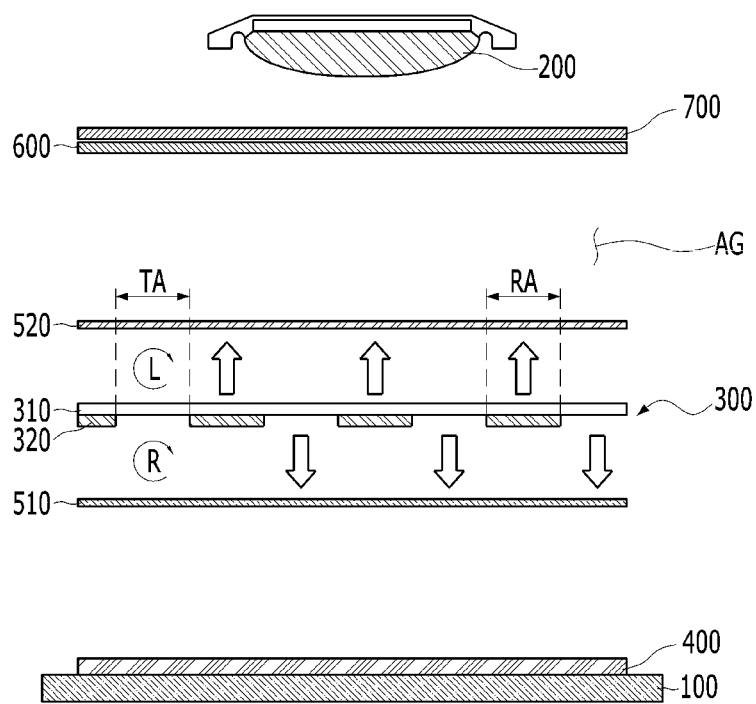

In the display device according to the embodiment of the present invention, the light moving toward the barrier 300 from the rear quarter-wave plate 520 can be reflected or transmitted on a region-by-region by the reflecting regions RA and the transmitting regions TA of the barrier 300, as shown in FIG. 12.

The light incident on the transmitting regions TA of the barrier 300 can transmit through the barrier 300 and move toward the front quarter-wave plate 510. The light incident on the reflecting regions RA of the barrier 300 can be reflected again toward the rear quarter-wave plate 520 by the reflective patterns 320. Since the light travelling toward the barrier 300 from the rear quarter-wave plate 520 is the light which is right-circularly polarized, the light reflected again toward the rear quarter-wave plate 520 by the reflective patterns 320 of the barrier 300 can be the light which is left-circularly polarized.

Figure 13:
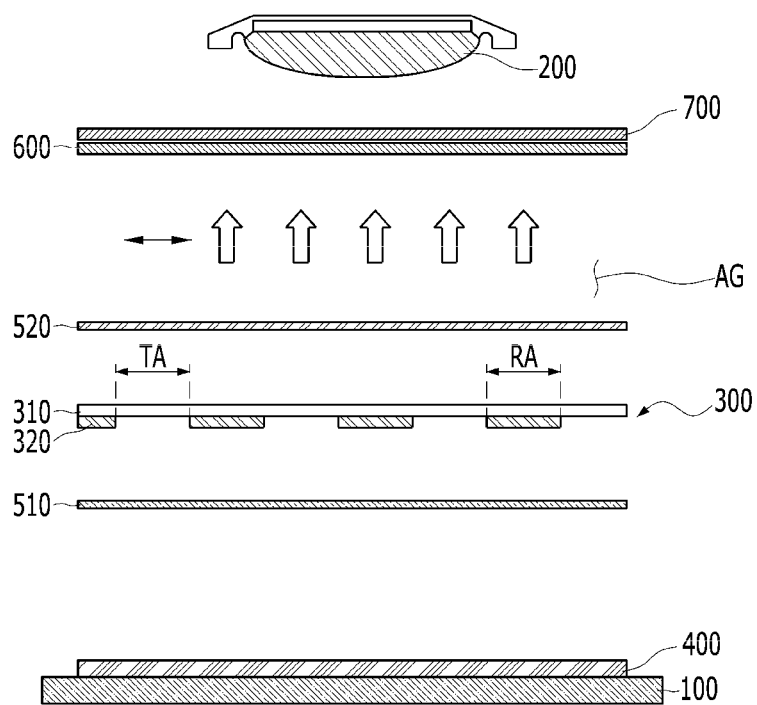

In the display device according to the embodiment of the present invention, the light reflected again by the reflective patterns 320 can transmit through the rear quarter-wave plate 520, as shown in FIG. 13.

The light passing through the rear quarter-wave plate 520 can move toward the reflective polarizing plate 600. Since the light reflected again by the reflective patterns 320 is the light which is left-circularly polarized, the light incident again on the reflective polarizing plate 600 after passing through the rear quarter-wave plate 520 can be the light which is linearly polarized in the second direction perpendicular to the first direction. Since the transmission axis of the reflective polarizing plate 600 is perpendicular to the transmission axis of the front linear polarizer 400, the light which is linearly polarized by the rear quarter-wave plate 520 can transmit through the reflective polarizing plate 600. Thus, in the display device according to the embodiment of the present invention, the path of the light travelling toward the eyepiece 200 from the display panel 100 can be increased by twice of a distance between the barrier 300 and the reflective polarizing plate 600.

Accordingly, the display device according to the embodiment of the present invention can increase the path of the light travelling toward the eyepiece 200 from the display panel 100 by the barrier 300 including the reflecting regions RA and the transmitting regions TA. That is, in the display device according to the embodiment of the present invention, the light moving toward the eyepiece 200 from the display panel 100 can not pass through an element that reduces the amount of the light passing through, such as a half-mirror. Thus, in the display device according to the embodiment of the present invention, the characteristic of the light provided to the user through the eyepiece 200 can be maintained, constantly. Therefore, in the display device according to the embodiment of the present invention, the light extraction efficiency can be increased without the change of the resolution.

Also, in the display device according to the embodiment of the present invention, each of the pixel regions PX can be disposed inside the corresponding transmitting region TA, so that the light travelling toward the rear quarter-wave plate 520 from the display panel 100 through the transmitting regions TA of the barrier 300 can be maximized. Thus, in the display device according to the embodiment of the present invention, the quality and the color reproduction rate of the image provided to the user can be improved, efficiently.

Figure 14:
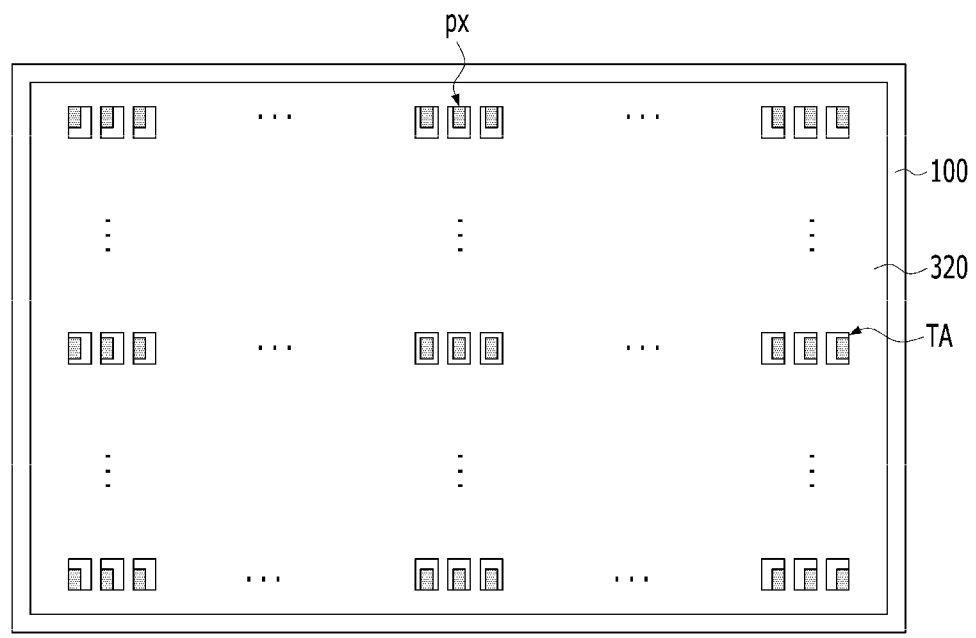
FIGS. 14 to 17 are views respectively showing the display device according to another embodiment of the present invention.

The display device according to the embodiment of the present invention is described that the relative location of each transmitting region TA is constant on the entire surface of the display panel 100. However, in the display device according to another embodiment of the present invention, the relative location of each transmitting region TA can be changed according to the position of the corresponding transmitting region TA in the display panel 100. For example, in the display device according to another embodiment of the present invention, the center of each transmitting region TA can be disposed closer to the center of the display panel 100 than the center of the corresponding pixel region PX, as shown in FIG. 14. That is, in the display device according to another embodiment of the present invention, each of transmitting regions TA can be disposed closer to the central portion of the display panel 100 than the corresponding pixel region PX. Thus, in the display device according to another embodiment of the present invention, the amount of the light provided to the user can be increased. Therefore, in the display device according to another embodiment of the present invention, the light extraction efficiency can be increased, efficiently.

Figure 15:
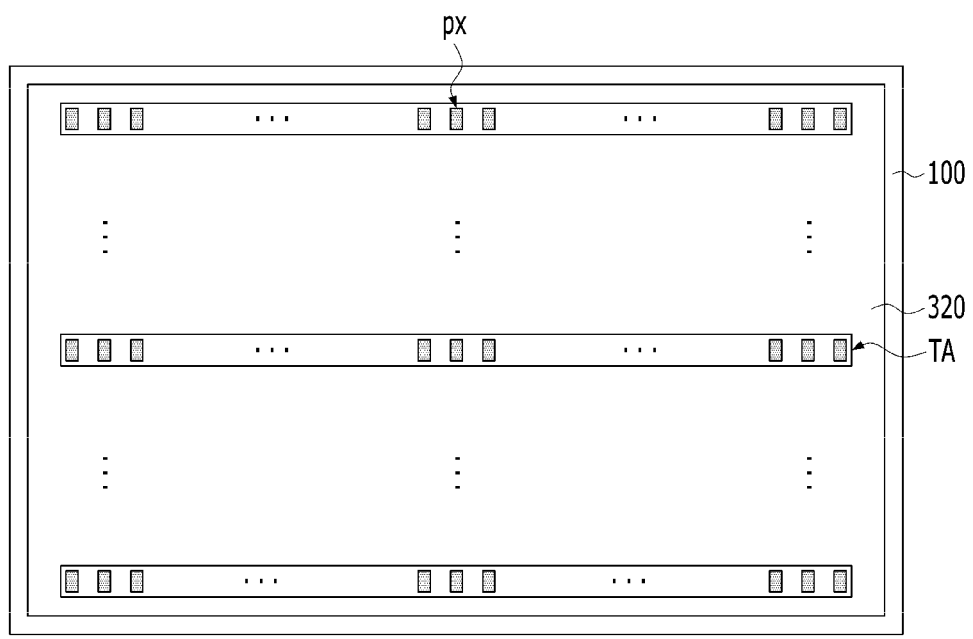

In the display device according to the embodiment of the present invention, the reflective patterns 320 of the barrier 300 overlap regions between the pixel regions PX of the display panel 100. However, in the display device according to another embodiment of the present invention, each of the transmitting regions TA of the barrier 300 can be in a bar shape extending in a direction, as shown in FIG. 15. Thus, in the display device according to another embodiment of the present invention, the process of forming the barrier 300 can be simplified. Therefore, in the display device according to another embodiment of the present invention, the light extraction efficiency and the productivity can be increased without the deterioration of the resolution.

Figure 16:
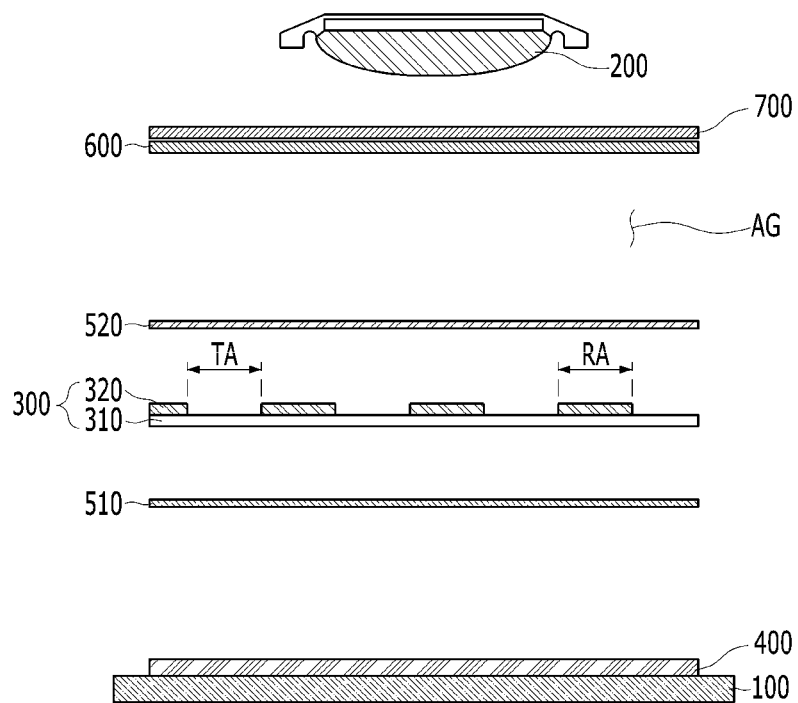

In the display device according to the embodiment of the present invention, the reflective patterns 320 are disposed between the front quarter-wave plate 510 and the supporting substrate 310. However, in the display device according to another embodiment of the present invention, the reflective patterns 320 can be disposed on a surface of the supporting substrate 310 facing the eyepiece 200, as shown in FIG. 16.

Thus, in the display device according to another embodiment of the present invention, the degree of freedom for the location and the forming process of the barrier 300 can be increased. Therefore, in the display device according to another embodiment of the present invention, the light extraction efficiency and the productivity can be efficiently increased without the deterioration of the resolution.

Figure 17:
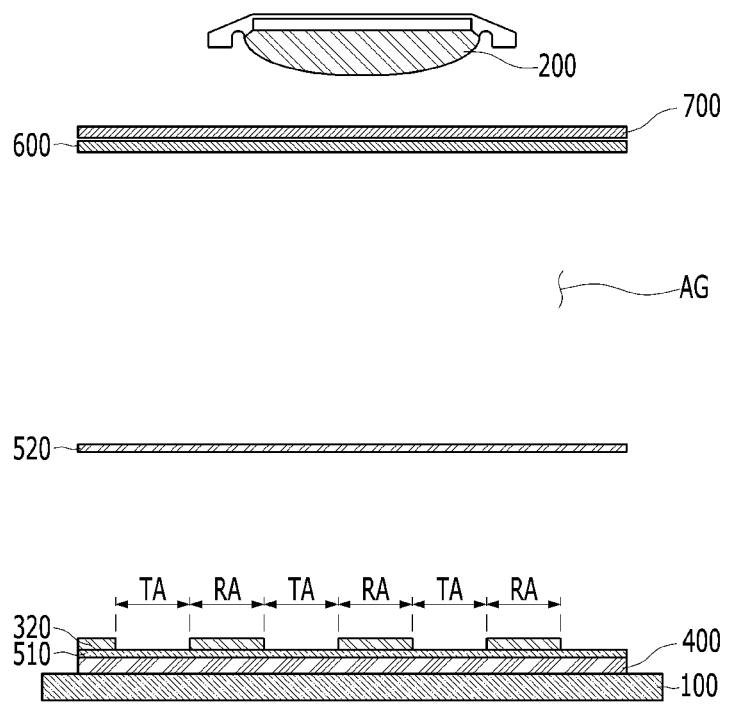

In the display device according to the embodiment of the present invention, the barrier 300 including the supporting substrate 310 and the reflective patterns 320 is disposed between the front quarter-wave plate 510 and the rear quarter-wave plate 520. However, the display device according to another embodiment of the present invention can include the reflective patterns 320 disposed on a surface of the front quarter-wave plate 510 facing the eyepiece 200, as shown in FIG. 17. For example, in the display device according to another embodiment of the present invention, a portion of the front quarter-wave plate 510 exposed by the reflective patterns 320 can overlap the pixel regions of the display panel 100. Thus, in the display device according to another embodiment of the present invention, the light reflected toward the display panel 100 by the reflective patterns 320 can be minimized. Further, in the display device according to another embodiment of the present invention, the path of the light increased by the reflective patterns 320 can be adjusted, efficiently. For example, in the display device according to another embodiment of the present invention, the front linear polarizer 400 can be in direct contact with the display panel 100 and the front quarter-wave plate 510. Therefore, in the display device according to another embodiment of the present invention, the overall thickness of the display device can be reduced, and the light extraction efficiency of the display device can be increased without the deterioration of the resolution of the display device.

As a result, the display device according to the embodiments of the present invention can include the front linear polarizer, a front quarter-wave plate, a barrier, a rear quarter-wave plate and a reflective polarizing plate between a display panel and an eyepiece, the barrier exposing a portion of the front quarter-wave plate. Thus, in the display device according to the embodiments of the present invention, the loss of the light between the eyepiece and the display panel can be minimized, and the path of the light travelling toward the eyepiece from the display panel can be increased. For example, in the display device according to the embodiments of the present invention, the light extraction efficiency can be increased without the deterioration of the resolution of the display device. Thereby, in the display device according to the embodiments of the present invention, the quality and the color reproduction rate of the image of the display device recognized by the user can be improved.

What is claimed is:

1. A display device comprising:
    an eyepiece on a display panel having pixel regions;
    a front quarter-wave plate between the display panel and the eyepiece;
    a rear quarter-wave plate between the front quarter-wave plate and the eyepiece;
    a front linear polarizer between the display panel and the front quarter-wave plate;
    a reflective polarizing plate between the rear quarter-wave plate and the eyepiece;
    a barrier between the front quarter-wave plate and the rear quarter-wave plate; and
    an air-gap between the rear quarter-wave plate and the reflective polarizing plate, wherein the barrier includes reflecting regions and transmitting regions between the reflecting regions, wherein the pixel regions of the display panel overlap the transmitting regions of the barrier, wherein each of the transmitting regions of the barrier has a larger size than each of the pixel regions of the display panel, and wherein the barrier is disposed closer to the display panel than the reflective polarizing plate.

2. The display device according to claim 1, wherein the barrier includes a supporting substrate and reflective patterns on the supporting substrate, and wherein the reflective patterns overlap the reflecting regions.

3. The display device according to claim 2, wherein the reflective patterns include a metal.

4. The display device according to claim 2, wherein the reflective patterns are disposed on a surface of the supporting substrate facing the display panel.

5. The display device according to claim 1,
wherein the front linear polarizer is in contact with the display panel, and
wherein the front quarter-wave plate is in contact with the front linear polarizer and the barrier.

6. The display device according to claim 1, wherein the pixel region overlaps the corresponding transmitting region.

7. The display device according to claim 6, wherein each of the transmitting regions is disposed closer to a center of the display panel than the pixel region overlapping the corresponding transmitting region.

8. The display device according to claim 1, wherein the display panel includes a light-emitting element between a lower substrate and an upper substrate.

9. The display device according to claim 1, wherein the pixel regions are respectively placed inside the transmitting regions.

10. A display device comprising:
a display panel including pixel regions;
a front linear polarizer on the display panel;
a front quarter-wave plate on the front linear polarizer;
a rear quarter-wave plate on the front quarter-wave plate;
a reflective polarizing plate on the rear quarter-wave plate;
an eyepiece on the reflective polarizing plate;
a barrier between the front quarter-wave plate and the rear quarter-wave plate, the barrier including reflecting regions on which reflective patterns are disposed, and transmitting regions overlapping with portions of the front quarter-wave plate exposed by the reflective patterns; and
an air-gap between the rear quarter-wave plate and the reflective polarizing plate,
wherein the pixel regions of the display panel overlap the transmitting regions of the barrier,
wherein each of the transmitting regions of the barrier has a larger size than each of the pixel regions of the display panel, and
wherein the barrier is disposed closer to the display panel than the reflective polarizing plate.

11. The display device according to claim 10, wherein the portion of the front quarter-wave plate exposed by the reflective patterns has a bar-shape extending in a direction.

12. The display device according to claim 10, wherein the reflective patterns are in direct contact with the front quarter-wave plate.

13. The display device according to claim 12, wherein the front linear polarizer is in direct contact with the display panel and the front quarter-wave plate.

14. The display device according to claim 10, wherein a phase of light passing through the rear quarter-wave plate is delayed in a direction opposite to a phase of light passing through the front quarter-wave plate.

15. The display device according to claim 14, wherein a polarized state of light passing through the reflective polarizing plate is perpendicular to a polarized state of the light passing through the front linear polarizer.

16. The display device according to claim 10, further comprising a rear linear polarizer between the reflective polarizing plate and the eyepiece,
wherein a transmission axis of the rear linear polarizer is parallel with a transmission axis of the reflective polarizing plate.

17. The display device according to claim 10, wherein the front linear polarizer is in contact with the display panel, and
wherein the front quarter-wave plate is in contact with the front linear polarizer and the reflective patterns of the barrier.

18. The display device according to claim 10, wherein the pixel regions are respectively placed inside the transmitting regions.

* * * * *